United States Patent
Kachian et al.

(10) Patent No.: US 9,773,663 B2
(45) Date of Patent: Sep. 26, 2017

(54) SELF-LIMITING AND SATURATING CHEMICAL VAPOR DEPOSITION OF A SILICON BILAYER AND ALD

(71) Applicants: Applied Materials, Inc., Santa Clara, CA (US); The Regents of the University of California, Oakland, CA (US)

(72) Inventors: Jessica S. Kachian, Sunnyvale, CA (US); Naomi Yoshida, Sunnyvale, CA (US); Mei Chang, Sunnyvale, CA (US); Mary Edmonds, San Diego, CA (US); Andrew C. Kummel, San Diego, CA (US); Sang Wook Park, La Jolla, CA (US); Hyunwoong Kim, La Jolla, CA (US)

(73) Assignees: Applied Materials, Inc., Santa Clara, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 15/230,218

(22) Filed: Aug. 5, 2016

(65) Prior Publication Data
US 2017/0040159 A1    Feb. 9, 2017

Related U.S. Application Data

(60) Provisional application No. 62/201,840, filed on Aug. 6, 2015.

(51) Int. Cl.
*H01L 21/02* (2006.01)

(52) U.S. Cl.
CPC .... *H01L 21/0228* (2013.01); *H01L 21/02164* (2013.01); *H01L 21/02178* (2013.01); *H01L 21/02205* (2013.01); *H01L 21/02211* (2013.01); *H01L 21/02271* (2013.01); *H01L 21/02299* (2013.01); *H01L 21/02301* (2013.01)

(58) Field of Classification Search
None
See application file for complete search history.

(56) References Cited

U.S. PATENT DOCUMENTS

2015/0303058 A1* 10/2015 Kummel .......... H01L 21/02387
                                                        257/76

OTHER PUBLICATIONS

S. Mokler et. al., Adsorption and Thermal Desoprtion of Chlorine from GaAs(100) Surfaces, J. of Vac. Sci. Technol. B, 10(6), (1992), 8 pages.

(Continued)

*Primary Examiner* — Jay C Chang
(74) *Attorney, Agent, or Firm* — Patterson + Sheridan LLP

(57) ABSTRACT

Embodiments described herein provide a self-limiting and saturating Si—$O_x$ bilayer process which does not require the use of a plasma or catalyst and that does not lead to undesirable substrate oxidation. Methods of the disclosure do not produce $SiO_2$, but instead produce a saturated Si—$O_x$ film with —OH termination to make substrate surfaces highly reactive towards metal ALD precursors to seed high nucleation and growth of gate oxide ALD materials.

20 Claims, 11 Drawing Sheets
(11 of 11 Drawing Sheet(s) Filed in Color)

(56) References Cited

OTHER PUBLICATIONS

W. Hung et al., Surface Etching of InP (100) by Chlorine, Surf. Sci. (418), (1998), 9 pages.

F. Lie et. al., Oxide Removal and Selective Etching of In from InSb(100) with TiCl4, J. of Phys. Chem. C, 115, (2011), 8 pages.

P. Gupta et. al., Hydrogen Desorption Kinetics from Monohydride and Dihydride Species on Silicon Surfaces, Phys. Rev. B, 37, (1988), 11 pages.

F. Hirose et. al., Low-temperature-atomic-layer-deposition of SiO2 with Tris(dimethylamino)silane (TDMAS) and Ozone using Temperature Controlled Water Vapor Treatment, ECS Transactions, 2009. 19(2), 10 pages.

J. Kang et. al., Mechanism of Atomic Layer Deposition of SiO2 on the Silicon (100)-2X1 Surface using SiCl4 and H2O as Precursors, J. Appl. Phys. 2002. 91(5), 8 pages.

G. Dingmans et. al., Plasma-Assisted ALD for the Conformal Deposition of SiO2: Process, Material and Electronic Properties, J. of Electrochemical Society. 2012. 159(3), 9 pages.

N.M. Russell, Kinetics of Hydrogen Desorption from Germanium-covered Si(100), Surface Science 369 (1996) 18 pages.

B. Shin et. al., Pre-atomic Layer Deposition Surface Cleaning and Chemical Passivation of (100) In 0.2 Ga 0.8 As and Deposition of Ultrathin Al 2 O 3 Gate Insulators, Appl. Phys. Lett., 93, (2008), 4 pages.

S. J. Pearton et. al., Damage Introduction in InP and InGaAs during Ar and H2 Plasma Exposure, Appl. Phys. Lett. 61, (1992), 4 pages.

El Kazzi et. al., Thermally Stable, Sub-nanometer Equivalent Oxide Thickness Gate Stack for Gate-first In0.53Ga0.47As Metal-oxide-semiconductor Field-effect-transistors, Appl. Phys. Lett. 100, (2012), 4 pages.

El Kazzi et. al., Sub-nm Equivalent Oxide Thickness on Si-passivated GaAs Capacitors with Low Dit, Appl. Phys. Lett. 99, (2011), 4 pages.

\* cited by examiner

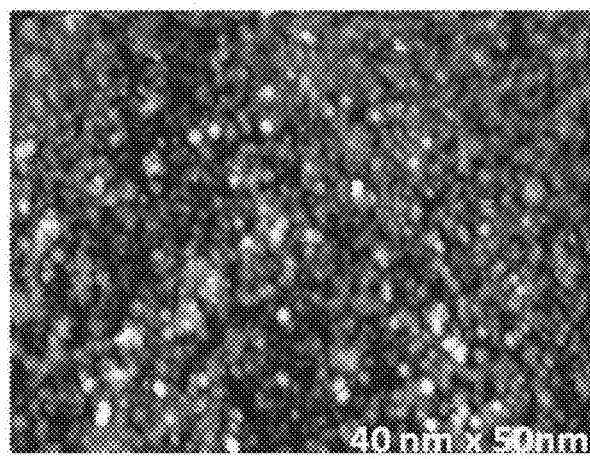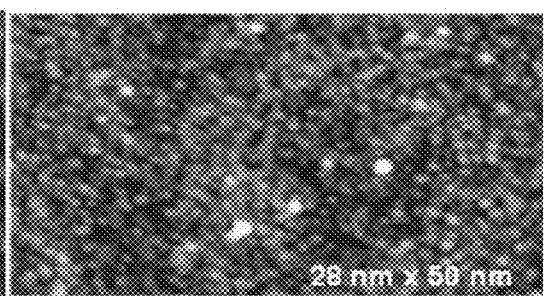
FIG. 7A                                    FIG. 7B

SELF-LIMITING AND SATURATING CHEMICAL VAPOR DEPOSITION OF A SILICON BILAYER AND ALD

CROSS-REFERENCE TO RELATED APPLICATIONS

This application claims benefit of U.S. provisional patent application Ser. No. 62/201,840, filed Aug. 6, 2015, the entirety of which is herein incorporated by reference.

BACKGROUND

Field

Embodiments of the present disclosure generally relate to semiconductor fabrication processes. More specifically, embodiments described herein relate to self-limiting and saturating chemical vapor deposition (CVD) and atomic layer deposition (ALD) methods.

Description of the Related Art

Atomic layer deposition (ALD) is a thin film deposition method in which a film is grown on a substrate by exposing its surface to alternate gaseous species (typically referred to as precursors). In contrast to chemical vapor deposition (CVD), the precursors are not present simultaneously in the reactor, but are introduced into the reaction chamber as a series of sequential, non-overlapping pulses. ALD processes are capable of producing very thin, conformal films with control of the thickness and composition of the films possible at the atomic level. As a result of the highly specific nature of ALD processes, surface characteristics of the substrate or layers formed thereon are factors which determine the characteristics of ALD films grown thereon.

CVD processes are generally considered to be non-self-limiting and utilize plasmas or catalysts to deposit films. These processes often lead to undesirable substrate oxidation, which reduces the reactivity and suitability of the as deposited film for subsequent processing. Thus, it is often difficult to form ALD films on substrates which have CVD deposited materials disposed thereon.

Thus what is needed in the art are improved CVD and ALD processes.

SUMMARY

In one embodiment, a substrate processing method is provided. The method includes heating a substrate in a reaction chamber to a temperature of between about 300° C. and about 500° C. and exposing the substrate to a chlorosilane precursor utilizing a chemical vapor deposition process. The substrate is also exposed to an anhydrous HOOH precursor utilizing the chemical vapor deposition process to deposit a chlorine terminated saturated silicon bilayer on the substrate.

In another embodiment, a substrate processing method is provided. The method includes heating a III-V material substrate in a reaction chamber to a temperature of between about 300° C. and about 500° C. and exposing the substrate to an $Si_2Cl_6$ precursor utilizing a chemical vapor deposition process. The substrate is also exposed to an anhydrous HOOH precursor utilizing the chemical vapor deposition process. The substrate is exposed to an $Si_2Cl_6$ precursor utilizing an atomic layer deposition process and the substrate is also exposed to an anhydrous HOOH precursor utilizing the atomic layer deposition process. The atomic layer deposition process cyclically exposes the substrate to $Si_2Cl_6$ and anhydrous HOOH in an alternating manner.

In yet another embodiment, a substrate processing method is provided. The method includes heating a III-V material substrate in a reaction chamber to a temperature of 350° C., dosing the substrate with about 87.6 MegaLangmuir $Si_2Cl_6$, and dosing the substrate with about 210.55 MegaLangmuir anhydrous HOOH after the doing the substrate with $Si_2Cl_6$. Further, the substrate is dosed with about 300,000 Langmuir trimethyl aluminum at about 250° C. and the substrate is dosed with about 500 Langmuir atomic hydrogen at about 250° C.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 7A illustrates an STM image of a substrate surface prior to treatment with trimethyl aluminum (TMA) according to one embodiment described herein.

FIG. 7B illustrates an STM image of a substrate surface after treatment with TMA according to one embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
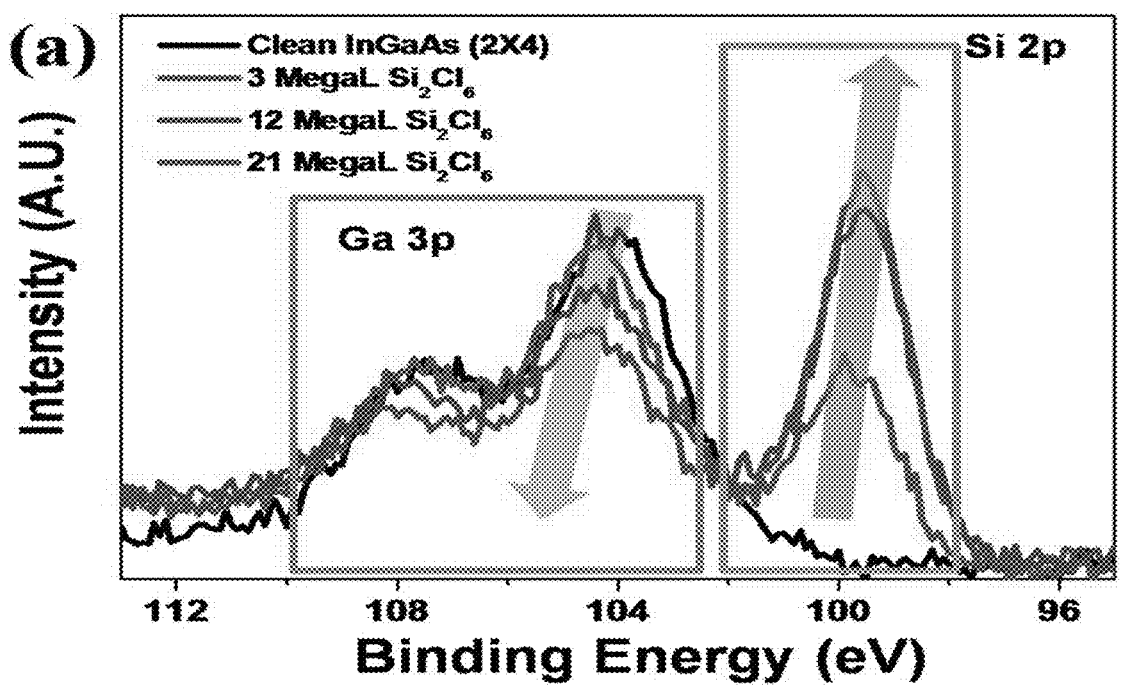
FIG. 1 illustrates x-ray photon spectroscopy (XPS) data for CVD deposited materials on a substrate according to one embodiment described herein.

Embodiments described herein provide a self-limiting and saturating Si—$O_x$ bilayer process which does not require the use of a plasma or catalyst and that does not lead to undesirable substrate oxidation. Methods of the disclosure do not produce $SiO_2$, but instead produce a saturated Si—$O_x$ film with —OH termination to make substrate surfaces highly reactive towards metal ALD precursors to seed high nucleation and growth of gate oxide ALD materials.

In one embodiment, a silicon oxide bilayer using $Si_2Cl_6$ and anhydrous peroxide is formed on III-V semiconductor surfaces. Another embodiment includes high density hydroxyl functionalization of silicon-germanium alloyed semiconductor surfaces using anhydrous peroxide for preparation of subsequent gate oxide ALD films or materials.

Various embodiments described herein provide for a universal control monolayer (UCM). Many technologies would benefit from a UCM that could be ALD or self-limiting CVD deposited on multiple materials and crystallographic faces. Si—OH is a leading candidate for use as the UCM, as silicon uniquely bonds strongly to all crystallographic faces of $InGa_{1-x}As$, $In_xGa_{1-x}Sb$, $In_xGa_{1-x}N$, SiGe, and Ge. Si—OH enables transfer of substrate dangling bonds to silicon, which may then subsequently be functionalized with an oxidant such as HOOH(g) in order to create the UCM terminating Si—OH layer. Embodiments described herein focus deposit a saturated Si—OH seed layer on InGaAs(001)-(2×4) at an substrate temperature of 350° C. XPS, in combination with STS/STM, are metrological tools employed to characterize the electrical and surface properties of the saturated Si—OH seed layer on InGaAs(001)-(2×4) and resulting data of such analysis if described in greater detail below. The 350° C. self-limiting CVD procedure includes a de-capped In0.53Ga0.47As (001)-(2×4) surface dosed with total 87.6 MegaLangmuir $Si_2Cl_6$ followed by 210.55 MegaLangmuir total anhydrous HOOH(g).

Complete saturation of silicon coverage is determined to occur once further dosing with $Si_2Cl_6$ leads to no further increase in the silicon 2p or further decrease in the substrate gallium 3p peak areas. Complete or substantially complete surface saturation of Si—Ox on InGaAs(001)-(2×4) was determined to occur once no further increase in the O 1s peak was seen with additional anhydrous HOOH(g) doses. Following Si—OH surface saturation, 300,000 L TMA was dosed at 250° C., and XPS data indicated the emergence of Al 2p and C 1s peaks indicative of TMA surface nucleation. The surface was then dosed with 500 L atomic H at 250° C. to remove methyl groups present on the surface aluminum and replace with —H termination as well as to remove any residual chlorine left on the surface. The surface was then exposed to air for 30 minutes, dosed with an additional 500 L atomic H at 250° C., and then STS measurements were performed. STM measurements of the Si—Ox surface indicate uniform surface coverage.

STS measurements show the surface Fermi level position moves towards midgap due to a surface dipole formation from —OH groups and oxygen bonding to the surface. TMA dosed on the Si—Ox surface shifts the Fermi level back towards the conduction band, consistent with unpinning and the —OH induced surface dipole being lessened through surface bonding with dimethylaluminum groups. Following hydrogen dosing and air exposure, the surface Fermi level remains near the conduction band edge consistent with the surface being stable and unreactive in air. MOSFET studies on InGaAs(001) show equivalent performance with $Si_2Cl_6$ pre-dosing compared to in-situ cleaning with atomic H.

Embodiments of the disclosure further provide for ALD of a $SiO_x$ layer on indium gallium arsenide (InGaAs), indium gallium antiminide (InGaSb), indium gallium nitride (InGaN), and silicon-germanium (SiGe) substrates of varying alloy compositions, as well as metallic substrates. First a saturated silicon bilayer with chlorine termination is deposited on the III-V substrate by dosing $Si_2Cl_6$ at a low CVD temperature, for example, less than about 500° C., such as about 350° C. More generally, for III-V substrates, a temperature range of between about 300° C. and about 500° C. can be used, and for other substrates (Ge, SiGe, Si), the temperature can be from about room temperature to about 500° C. Next, anhydrous peroxide is dosed at 350° C. in order to produce a saturated Si—$O_x$ bilayer on the III-V surface without oxidizing the substrate and leaving the surface functionalized with hydroxyl groups ready for nucleation of any metal ALD precursor. Following the self-limiting and saturating deposition of an $SiO_x$ bilayer on the III-V surface, $Si_2Cl_6$ and anhydrous HOOH(g) may be cyclically dosed to deposit an ALD $SiO_x$ multilayer by inducing HOCl(g) or other desorption byproducts. On the SiGe substrate, anhydrous peroxide is dosed at between about room temperature and about 120° C. to leave the surface saturated and functionalized with hydroxyl groups ready for nucleation of any metal ALD precursor. An $SiO_x$ multilayer can also be deposited by ALD on the SiGe substrate, as the Si—$Cl_x$ reaction with anhydrous HOOH(g) or with an —OH surface terminating layer leads to the byproduct formation such as HOCl(g) and the formation of Si—$O_x$. This cyclic process may be repeated to produce the desired thickness of the $SiO_x$ overlayer.

The $SiO_x$ overlayer with hydroxyl termination on III-V surfaces serves several purposes. (1) The saturated CVD bilayer of silicon with Cl termination may react with an oxidant such as anhydrous HOOH(g) in order to create an Si—OH terminating layer which would react with nearly any metal ALD precursor thereby eliminating the need for metal precursor nucleation (for example with pre-dosing of trimethyl aluminum) decreasing equivalent oxide thickness (EOT) and lowering border trap density and fixed charged associated with interfacial layers or even direct bonding of oxide to non-silicon semiconductors. The same procedure can be used for other crystallographic faces such as $In_xGa_{1-x}As(110)$, $In_xGa_{1-x}Sb(110)$, $In_xGa_{1-x}N(110)$. (2) The Si—$O_x$ overlayer may also be employed for metal contact formation.

Functionalization of the SiGe surface by dosing anhydrous peroxide at room temperature serves to increase the —OH nucleation density by 1.6-4.6 times as compared with aqueous peroxide and water based oxidation processes at room temperature, and after annealing at 300° C. produces an Si—OH terminated surface. By cyclically dosing $Si_2Cl_6$ and anhydrous HOOH(g), an $SiO_x$ multilayer can be deposited by ALD leaving the surface protected and terminated by Si—OH and ready for subsequent ALD.

The fully chlorinated disilane precursor self-limiting CVD process produces saturation when all surface sites are terminated by Si—Cl groups thus, desorption of $Cl_2(g)$, HCl(g), or other $ACl_x$ (A=group III or group IV element) from substrate surface sites is contemplated until all or substantially all surface sites become terminated by Si—Cl. $SiO_x$ ALD on top of the saturated self-limited CVD silicon seed layer with chlorine termination may be done through a Cl/OH exchange reaction where gasses such as HOCl(g) desorb from the surface and —OH termination replaces Cl through anhydrous HOOH(g) dosing.

As utilized herein, functionalization is creating a surface which is reactive to ALD precursors. Passivation is forming a monolayer or thin control layer which leaves the Fermi level unpinned. Monolayer nucleation is initiation of the ALD process in each unit cell. The silicon saturating and self-limiting CVD process described herein followed by subsequent self-limiting oxidation on III-V surfaces achieves all three requirements. In one embodiment, the CVD process is performed at a low CVD temperature, e.g. 350° C., which is comparable to silicon ALD procedures on both metallic and semiconductor substrates. However, the CVD process according to the exemplary processes include a self-limiting and saturating desorption limited CVD component for depositing the silicon seed layer with chlorine termination. The self-limiting and saturating silicon CVD process at 350° C. is unique because saturating growth of silicon via a low temperature CVD process can be achieved. The unique strong bonding of silicon to all crystal faces of $In_xGa_{1-x}As$, $In_xGa_{1-x}Sb$, $In_xGa_{1-x}N$, is expected to provide transfer of the dangling bonds from the substrate to silicon, and chlorine terminated silicon is readily functionalized by anhydrous HOOH(g) due to the uniquely strong Si—$O_x$ bonds and the induced desorption of gasses such as HOCl (g). By way of advantage, the high flux processing during the ALD stages prevents oxygen and carbon contamination.

The oxidation process according to embodiments described herein employs an anhydrous HOOH(g) to replace surface chlorine termination with —OH termination by inducing the HOCl(g) byproduct formation at 350° C. Once all surface silicon bonds have reacted with anhydrous HOOH(g), the anhydrous HOOH(g) does not attack silicon back-bonds to the III-V substrate, and the oxidation reaction terminates leaving a saturated Si—OH layer on the surface. Monolayer or multilayer $SiO_x$ growth with —OH termination is ideal for nucleating almost any metal ALD precursor on both Si/III-V and SiGe surfaces. On SiGe, the anhydrous HOOH forms an —OH terminated surface without subsurface oxidation up to least 120° C.

Embodiments described herein utilize anhydrous HOOH (g). The anhydrous HOOH(g) is shown to prevent substrate oxidation of InGaAs even at elevated temperature and is expected to prevent substrate oxidation at elevated temperature on SiGe and Ge during $SiO_x$ or $SiO_xH_y$ deposition.

In one embodiment, a subsequent ALD process is performed after the CVD process. One embodiment includes ALD of a Si—Nx monolayer or multilayer growth on indium gallium arsenide (InGaAs), indium gallium antiminide (InGaSb), indium gallium nitride (InGaN), SiGe, Ge, Si and other semiconductor substrates of varying alloy compositions, as well as metallic substrates. First, the substrate surface is functionalized by —NHx termination by dosing high pressure pulses of $N_2H_4$ at low temperatures below about 300° C., e.g. 275° C. Next, $Si_2Cl_6$ is dosed at the low temperature (e.g. 275° C.) in order to produce a Si—Nx terminating layer on the semiconductor surface through the production of an HCl(g) byproduct. This cyclic dosing process can be repeated to produce the desired thickness of the deposited Si—Nx overlayer. Existing silicon nitride ALD processes are at higher temperatures (above 310° C. even for plasma based processing) and many reports also emphasize the need for high temperature annealing (>350° C.) in order to achieve stoichiometric Si—Nx films with high quality electrical properties. In one embodiment, the ALD process described herein does not require high temperature post annealing after Si—Nx film deposition, the processing temperature is kept lower than conventional ALD processes.

Self-limiting and saturating chemical vapor deposition methods of a silicon bilayer with chlorine termination according to embodiments described herein are based upon the saturation of the III-V semiconductor substrate or metallic surface sites through a surface termination with Si—Cl groups by dosing chlorosilane precursors at low temperatures, e.g. 350° C. Chlorosilane precursors include but are not limited to $SiCl_4$, $Si_2Cl_6$, and $Si_3Cl_8$. Evaluation results with $Si_2Cl_6$ support utilization of other precursors. Once all surface sites are terminated with Si—Cl groups, the reaction becomes self-terminating, as chlorine bonds to silicon stronger than all other semiconductor or metallic materials.

In one example, the self-limiting and saturating CVD process includes forming a clean $In_{0.53}Ga_{0.47}As(001)$-(2×4) surface (via decapping or atomic H in-situ cleaning), dosing with at least 3 MegaLangmuir of $Si_2Cl_6$ at a temperature of 350° C. For the purpose of this description, 3 Mega-Langmuir of $Si_2Cl_6$ is denoted as a cycle; however, more than one cycle may be utilized to reach saturation. To complete the self-limiting and saturating silicon seed layer, an additional 3 cycles, and an additional 6 cycles of 3 MegaLangmuir of $Si_2Cl_6$ at 350° C. are dosed. X-ray photoelectron spectroscopy (XPS) spectrum data taken of the surface following 1, 4, and 7 CVD cycle doses with a monochromatic aluminum channel X-ray source system at a glancing angle of 30° was used to verify whether surface saturation of silicon with chlorine termination occurred.

FIG. 1 illustrates the increase of the silicon 2p3/2 peak and the decrease in the substrate gallium 3p3/2 peak, as indicated by the red and blue arrows for both spectra as well as the spectra of the clean de-capped surface for comparison. In comparing the substrate gallium 3p3/2 peak for the 4 and 7 cycle surfaces, there is no further decrease in this gallium 3p3/2 substrate peak, indicative of self-limiting and saturating surface coverage of silicon with chlorine termination. There is a negligible increase in the silicon 2p peak when comparing the 4 and 7 cycle surfaces, and this is consistent with a desorption limited CVD process where once the surface is terminated by Si—Cl groups, no further growth is seen and surface saturation occurs. The indium, gallium, and arsenic substrate peaks are present on the sample, thus, a decrease in these peaks will indicate increased surface coverage.

Figure 2:
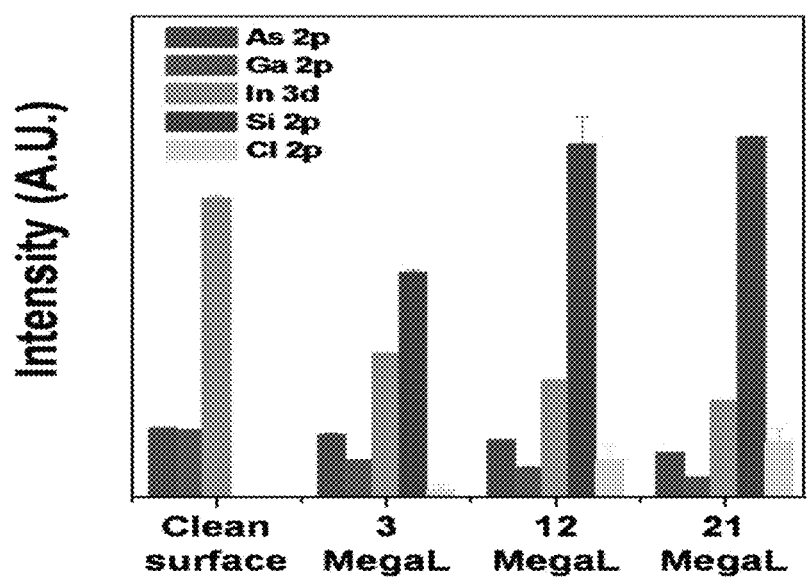
FIG. 2 illustrates XPS data for CVD deposited materials on a substrate according to one embodiment described herein.

FIG. 2 illustrates the raw counts corrected by Schofield photoionization cross sectional relative sensitivity factors are recorded for doublet peak pairs of As 2p, Ga 2p, In 3d, Si 2p, and Cl 2p for the clean de-capped $In_{0.53}Ga_{0.47}As$ (001)-(2×4) surface as well as the 1, 4, and 7 CVD cycle dosed surfaces at sample temperature 350° C. The 1 cycle CVD dosed surface at 350° C. shows negligible presence of chlorine, indicating this surface is below monolayer silicon saturation coverage, as $Cl_x$ species are still desorbing from unreacted In, Ga, or As substrate sites. The As 2p, Ga 2p, In 3d substrate peaks undergo little to no decrease in comparing the 4 and 7 CVD cycle surfaces consistent with saturation of silicon on the $In_{0.53}Ga_{0.47}As(001)$-(2×4) surface being reached after 7 self-limiting and saturating CVD cycles at 350° C. $Cl_2$ and $SiCl_x$ desorption is close to zero at 350° C. on silicon. The Si2p/(In3d+Ga2p+As2p) ratio closely corresponds to the calculated thickness of the deposited silicon capping layer, which can be calculated from the equation $\ln(I/I_o)=-t/\lambda$, where I is the sum of the intensity of the In 3d, Ga 2p, and As 2p peaks following each $Si_2Cl_6$ dose, $I_o$ is the sum of the intensity of the In 3d, Ga 2p, and As 2p peaks on the clean InGaAs(001)-(2×4) surface, t is the thickness of the deposited silicon layer, and λ is the inelastic mean free path of the collected electrons of the InGaAs substrate (1 nm). Using this equation, the total 21 MegaLangmuir $Si_2Cl_6$ dose saturates at about 2.5 monolayers of silicon coverage with chlorine termination.

Figure 3A:
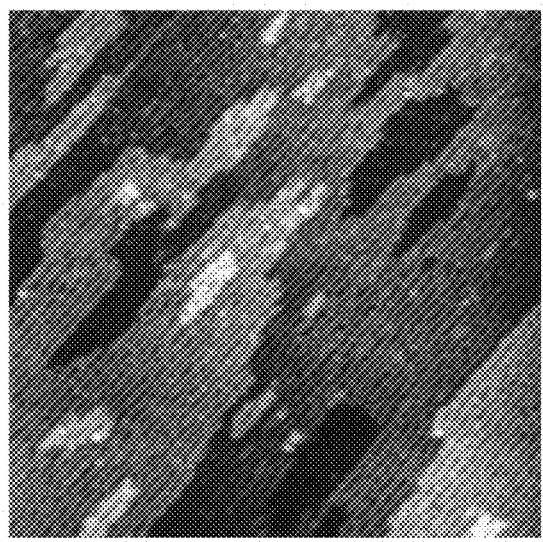
FIG. 3A illustrates a scanning tunneling microscope (STM) image prior to CVD material deposition according to one embodiment described herein.
Figure 3B:
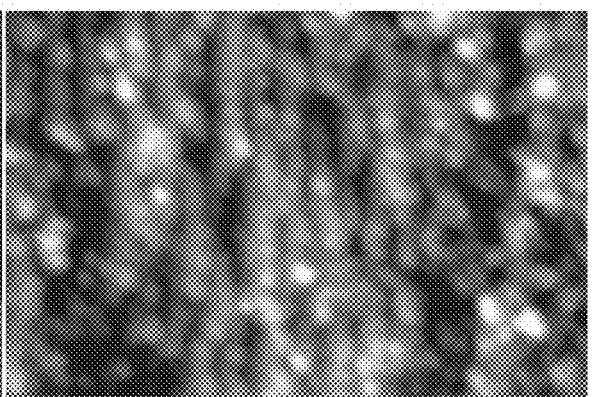
FIG. 3B illustrates an STM image after CVD material deposition according to one embodiment described herein.

FIG. 3 illustrates the filled-state STM images of the $In_{0.53}Ga_{0.47}As$(001)-(2×4) surface before (FIG. 3A) and after (FIG. 3B) 7 CVD cycles of $Si_2Cl_6$ dosed at 350° C. followed by 500 Langmuir atomic hydrogen dosed at 350° C. The dosed surface contains high atomic surface order and the surface is terminated by Si—H, leaving the surface Fermi level unpinned. FIGS. 3A and 3B illustrate silicon absorption in a commensurate structure with average row spacing being nearly identical to the $In_{0.53}Ga_{0.47}As$(001)-(2×4) surface at 1.5 nm, consistent with III-V dangling bond elimination.

Figure 4:
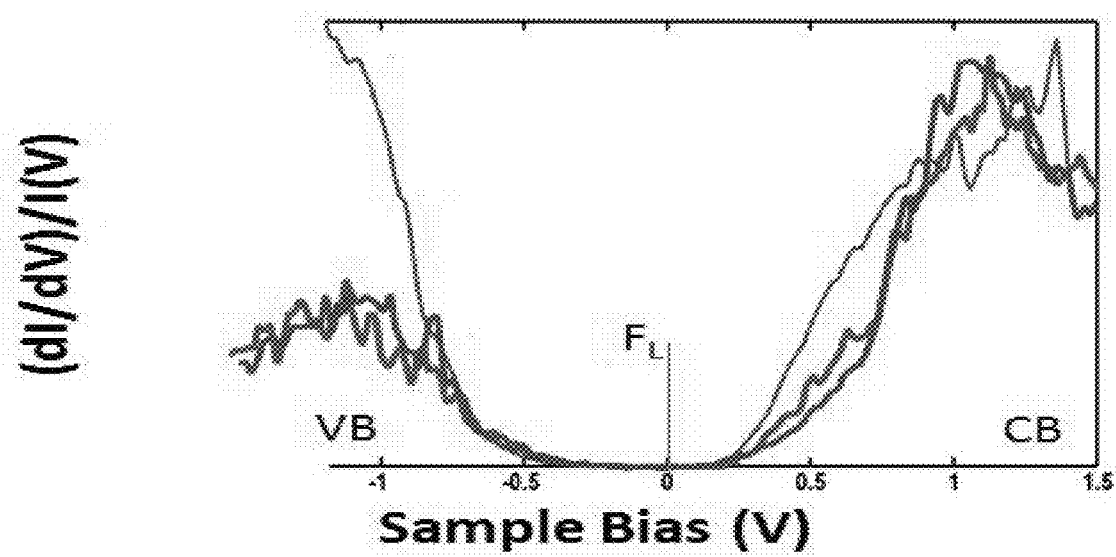
FIG. 4 illustrates scanning tunneling spectroscopy (STS) results for a clean, de-capped InGaAs substrate according to one embodiment described herein.

It is contemplated that the self-limiting and saturating CVD nucleation schemes translate well on other crystallographic faces, such as $In_xGa_{1-x}As$(110), $In_xGa_{1-x}Sb$(110), $In_xGa_{1-x}N$(110), as silicon binds strongly to these materials. The desorption product is $GaCl_3$ and $InCl_3$; therefore, the process also removes excess Ga and In from the surface which improves the electronic properties of the material. FIG. 4 illustrates the scanning tunneling spectroscopy (STS) results for the clean de-capped n-type $In_{0.53}Ga_{0.47}As$(001)-(2×4) surface as well as the 1 and 7 CVD cycle dosed surfaces, where each CVD cycle consists of 3 MegaLangmuir of $Si_2Cl_6$ dosed at 350° C. STS essentially probes the local density of states of the surface, and after 1 and 7 cycles, the surface Fermi level remains at the same location as the clean surface, slightly above midgap with conduction and valance band edges also lining up. This indicates that the silicon deposition process does not pin the Fermi level nor degrade the surface density of states by creating defect states in the band gap.

Following the deposition of the thin silicon seed layer with chlorine termination on the InGaAs(001)-(2×4) surface at 350° C. using $Si_2Cl_6$, a series of anhydrous HOOH(g) doses are pulsed at 350° C. in order to saturate the Si—$O_x$ coverage. First, 555,500 Langmuir anhydrous HOOH(g) is dosed at 350° C. followed by an additional 6 MegaLangmuir, 24 MegaLangmuir, a first 60 MegaLangmuir, a second 60 MegaLangmuir, and a third 60 MegaLangmuir dose, all at 350° C.

Figure 5:
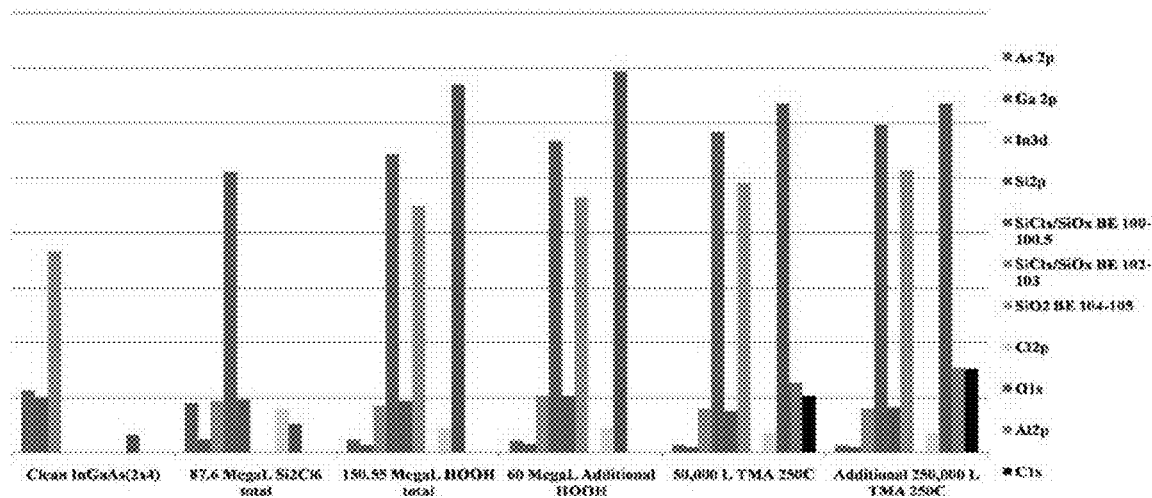
FIG. 5 illustrates XPS data for ALD deposited materials on a substrate according to one embodiment described herein.

FIG. 5 illustrates the XPS raw counts corrected by Schofield photoionization cross sectional relative sensitivity factors recorded for doublet peak pairs of As 2p, Ga 2p, In 3d, Si 2p, Cl 2p, and O1s for the clean de-capped $In_{0.53}Ga_{0.47}As$ (001)-(2×4) surface, the de-capped surface following 87.6 MegaLangmuir $Si_2Cl_6$, the de-capped surface following 87.6 MegaLangmuir $Si_2Cl_6$ plus 150.55 MegaLangmuir total HOOH(g), and the d-capped surface following 87.6 MegaLangmuir $Si_2Cl_6$ plus 150.55 MegaLangmuir total HOOH(g) and an additional 60 MegaLangmuir HOOH(g) all at a sample temperature of 350° C. 87.6 MegaLangmuir $Si_2Cl_6$ dosed on InGaAs(001)-(2×4) at 350° C. is equivalent to the 21 MegaLangmuir $Si_2Cl_6$ dose on InGaAs(001)-(2×4) at 350° C. described above as the Si2p/(In3d+Ga2p+As2p) ratio equals ~2.5 in both experiments. The discrepancy in dosed amounts can be explained by the change in the high vacuum dosing chamber setup between experiments and the change in position of the convectron gauge used to measure the dosing pressure.

In comparing the 150.55 MegaLangmuir total HOOH(g) with the additional (e.g. third dose)) 60 MegaLangmuir HOOH(g) dose at 350° C., there is a negligible increase in oxygen coverage seen on the surface consistent with Si—$O_x$ surface saturation. Si—$Cl_x$ reaction with HOOH(g) leads to the byproduct formation of HOCl(g) and the formation of Si—$O_x$ bonds, although there is still some residual chlorine seen on the surface following the saturation dose of anhydrous HOOH(g) at 350° C. Following the total 210.55 MegaLangmuir anhydrous HOOH(g) dose at 350° C. to form the saturated Si—$O_x$ bilayer on InGaAs(001)-(2×4), the surface is then dosed with 50,000 Langmuir of TMA followed by an additional 250,000 Langmuir TMA at 250° C. and the XPS results are illustrated in FIG. 5. FIG. 5 also illustrates the XPS raw counts corrected by Schofield photoionization cross sectional relative sensitivity factors recorded for doublet peak pairs of Al 2p, and for C 1s. The XPS results show TMA is able to react with Si—$O_x$ at 250° C., consistent with the Si—$O_x$ surface being terminated with highly reactive —OH groups which assist the high nucleation of gate oxide ALD growth. Results also indicate TMA reacts on the Si—$O_x$ surface and saturates as there is a negligible change in aluminum and carbon coverage seen when comparing the 50,000 Langmuir and additional 250,000 Langmuir TMA doses at 250° C. Once the $SiO_x$ bilayer has been deposited, $SiO_x$ ALD may also be performed to grow an $SiO_x$ multilayer on the InGaAs(001)-(2×4) surface by cyclically dosing $Si_2Cl_6$ and anhydrous HOOH(g) at 350° C.

Figure 6:
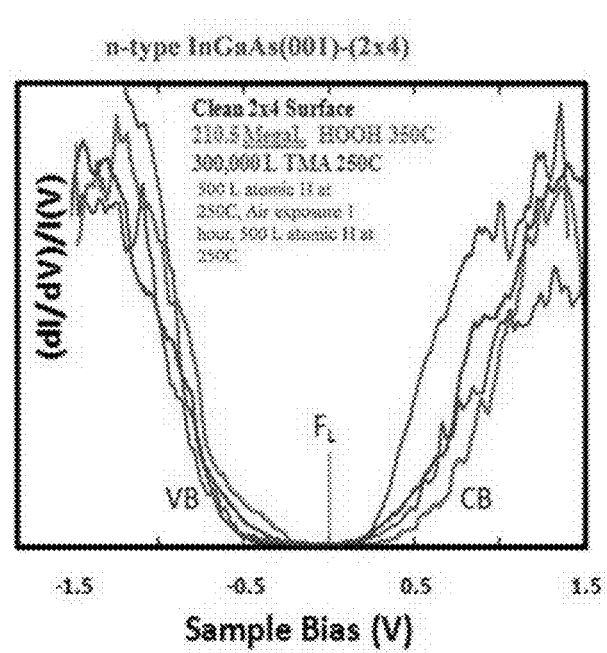
FIG. 6 illustrates STS results a clean, de-capped InGaAs substrate with an additional dosed surface according to embodiments described herein.

FIG. 6 illustrates the scanning tunneling spectroscopy (STS) results for the clean de-capped n-type $In_{0.53}Ga_{0.47}As$ (001)-(2×4) surface as well as the 87.6 MegaLangmuir $Si_2Cl_6$ dosed surface, the 210.55 MegaLangmuir anhydrous HOOH(g) plus 87.6 MegaLangmuir $Si_2Cl_6$ dosed surface, and the 300,000 L TMA plus 210.55 MegaLangmuir anhydrous HOOH(g) plus 87.6 MegaLangmuir $Si_2Cl_6$ dosed surface. STS essentially probes the local density of states of the surface, and after 87.6 MegaLangmuir $Si_2Cl_6$ dose, the surface Fermi level remains at the same location as the clean surface, slightly above midgap with conduction and valance band edges also lining up, indicating the silicon deposition process does not pin the Fermi level nor degrade the surface density of states by creating defect states in the band gap. Following the anhydrous HOOH(g) dosing, the Fermi level position moves towards midgap due to a surface dipole formation from —OH groups and oxygen bonding to the surface. Once the Si—Ox surface is dosed with TMA, the surface Fermi level shifts back towards the conduction band, consistent with the surface Fermi level being unpinned and the —OH induced surface dipole being lessened through surface bonding with dimethylaluminum groups. Following TMA dosing, the surface is dosed with 500 Langmuir atomic hydrogen at 250° C. in order to remove the methyl groups on the surface aluminum and replace with hydrogen termination as well as remove any residual chlorine left on the surface. The surface is then exposed to air for 30 minutes, dosed with an additional 500 Langmuir atomic hydrogen at 250° C. to remove any unwanted hydrocarbon contamination from the air exposure, and then STS measurements were performed to determine whether the surface is electrically passivated and air stable. Atomic hydrogen is produced via a thermal gas cracker which acts to split $H_2$ gas into atomic hydrogen by employing a hot iridium tube. The STS results are also shown in FIG. 6 and it can be seen that the local surface density of states maintains an unpinned surface Fermi level following the hydrogen dosing and 30 minute air exposure consistent with the surface being stable and unreactive in air.

FIG. 7A illustrates the filled state STM image of the $In_{0.53}Ga_{0.47}As(001)$-(2×4) surface following 87.6 MegaLangmuir $Si_2Cl_6$ and the saturation anhydrous HOOH(g) dose of 210.55 MegaLanmguir. All doses were done at a sample temperature of 350° C. and no further annealing was performed. As depicted, FIG. 7A shows the saturated Si—$O_x$ bilayer on InGaAs(001)-(2×4) produces a uniform surface coverage. FIG. 7B illustrates the InGaAs(001)-(2×4) surface following 87.6 MegaLangmuir $Si_2Cl_6$, 210.55 MegaLanmguir anhydrous HOOH(g), and 300,000 Langmuir TMA. TMA doses were performed at 250° C. As depicted, FIG. 7B shows uniform surface coverage following TMA dosing indicating the Si—$O_x$ bilayer is able to seed high nucleation of subsequent ALD gate oxide growth.

When the Si—$O_x$ layer on InGaAs(001)-(2×4) is formed using $Si_2Cl_6$ and a 30% HOOH (70% water) source instead of the anhydrous HOOH(g), substrate oxidation is seen at substrate temperatures of 200° C. and 350° C.

Figure 8:
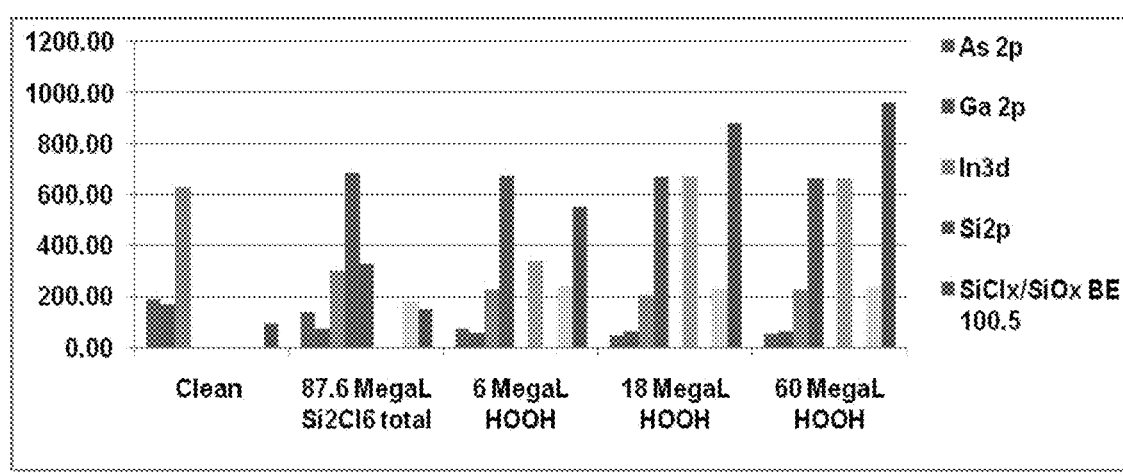
FIG. 8 illustrates XPS data of a substrate with varying precursor exposures according to embodiments described herein.

FIG. 8 illustrates the XPS raw counts corrected by Schofield photoionization cross sectional relative sensitivity factors recorded for doublet peak pairs of As 2p, Ga 2p, In 3d, Si 2p, Cl 2p, and O1s for the clean de-capped $In_{0.53}Ga_{0.47}As$ (001)-(2×4) surface, the de-capped surface following 87.6 MegaLangmuir $Si_2Cl_6$, the de-capped surface following 87.6 MegaLangmuir $Si_2Cl_6$ plus 24 MegaLangmuir total 30% HOOH(g), and the de-capped surface following 87.6 MegaLangmuir $Si_2Cl_6$ plus 84 MegaLangmuir total HOOH (g). The 87.6 MegaLangmuir $Si_2Cl_6$ was dosed at a substrate temperature of 350° C. and the 30% HOOH(g) was dosed at a substrate temperature of 200° C. Following the total 24 MegaLangmuir and 84 MegaLangmuir total 30% HOOH(g) doses, there was an observed shift of the Ga 2p and As 2p peaks to higher binding energies consistent with the substrate being oxidized.

FIG. 8 illustrates the XPS results indicating an increase in the In 3d corrected peak area following the total 84 MegaLangmuir 30% HOOH(g) dose consistent with indium segregation to the surface occurring. The Si2p/(In3d+Ga2p+As2p) ratio for this surface is 1.5, showing that the silicon coverage on this surface is approximately ⅔ the coverage of silicon deposited in the anhydrous HOOH(g) dosing experiments shown in FIGS. 5-7. The difference of silicon coverage between the two experiments can be attributed to different dosing pressures and dosing times being used before having a standard recipe to create a saturated 2.5 monolayers of silicon coverage on the surface. This difference in silicon coverage on the InGaAs(001)-(2×4) surface may contribute to the substrate oxidation which occurred when oxidizing the deposited silicon seed layer by 30% HOOH(g). It is contemplated that the higher presence of water in the 30% HOOH(g) vapor leads to the substrate oxidation. Water dissociates into —OH and —H, and HOOH dissociates into 2 —OH groups. The Si—$O_x$ films formed by oxidation with 30% HOOH(g) may be more porous as compared to the anhydrous HOOH(g) produced films, and the higher porosity may contribute to the indium out diffusion.

Figure 9:
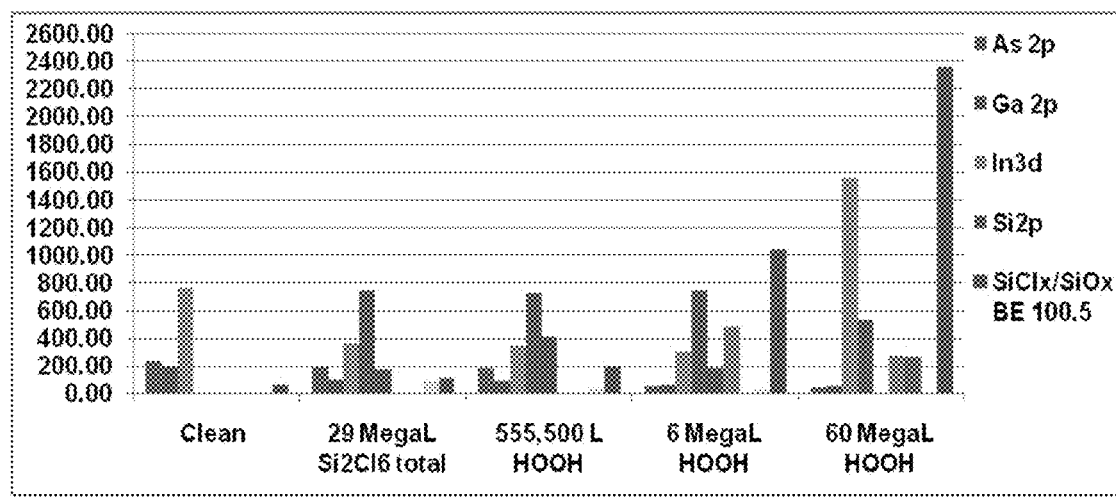
FIG. 9 illustrates XPS data of an $Si-O_x$ layer on an InGaAs substrate according to embodiments described herein.

FIG. 9 illustrates the results of the Si—$O_x$ layer on InGaAs(001)-(2×4) formed using $Si_2Cl_6$ and 30% HOOH (70% water) at a substrate temperature of 350° C. As depicted, FIG. 9 shows the XPS raw counts corrected by Schofield photoionization cross sectional relative sensitivity factors recorded for doublet peak pairs of As 2p, Ga 2p, In 3d, Si 2p, Cl 2p, and O1s for the clean de-capped $In_{0.53}Ga_{0.47}As(001)$-(2×4) surface, the de-capped surface following 29 MegaLangmuir $Si_2Cl_6$, the de-capped surface following 29 MegaLangmuir $Si_2Cl_6$ plus 555,500 Langmuir 30% HOOH(g), and the de-capped surface following 29 MegaLangmuir $Si_2Cl_6$ plus 6.55 MegaLangmuir total HOOH(g), and the d-capped surface following 29 MegaLangmuir $Si_2Cl_6$ plus 66.55 MegaLangmuir total HOOH(g). The 87.6 MegaLangmuir $Si_2Cl_6$ was dosed at a substrate temperature of 350° C. and the 30% HOOH(g) was dosed at a substrate temperature of 350° C.

The XPS results in FIG. 9 show a large increase in the In 3d corrected peak area following the total 60.55 MegaLangmuir 30% HOOH(g) dose consistent with a large amount of indium segregation to the surface occurring. The Si2p/(In3d+Ga2p+As2p) ratio for this surface is 1.2, indicating that the silicon coverage on this surface is approximately ½ the coverage of silicon deposited in the anhydrous HOOH(g) dosing experiments shown in FIGS. 5-7. This difference in silicon coverage on the InGaAs(001)-(2×4) surface may contribute to the substrate oxidation which occurred when oxidizing the deposited silicon seed layer by 30% HOOH(g).

It is contemplated that the higher presence of water in the 30% HOOH(g) vapor leads to the substrate oxidation. Water dissociates into —OH and —H, and HOOH dissociates into 2 —OH groups. The Si—$O_x$ films formed by oxidation with 30% HOOH(g) may be more porous as compared to the anhydrous HOOH(g) produced films, and the higher porosity may contribute to the indium out diffusion.

The high nucleation of hydroxyl groups on the SiGe surface by anhydrous peroxide begins with a 500° C. sputter cleaned p-type $Si_{0.5}Ge_{0.5}(110)$ surface dosed with a total of 1.5 Mega Langmuir of anhydrous HOOH(g) at room temperature. While sputter cleaning is utilized in the embodiments described herein, it is contemplated that other cleaning techniques could also be employed. The anhydrous HOOH(g) is dosed on the sputter cleaned $Si_{0.5}Ge_{0.5}(110)$ surface at 0.023 Torr for a pulse time of 3 seconds for approximately 22 pulses.

Figure 10:
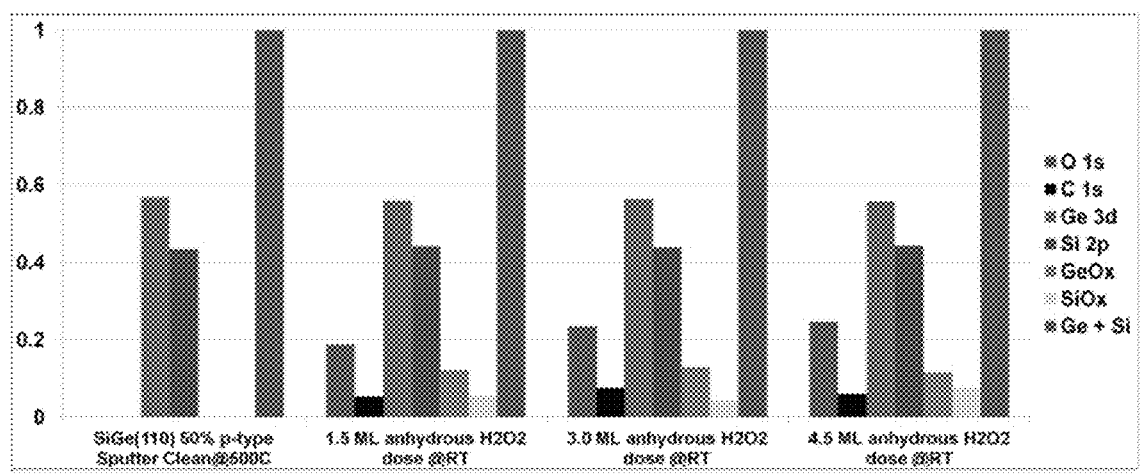
FIG. 10 illustrates XPS data of a cleaned substrate and substrates exposed to anhydrous $H_2O_2$ according to one embodiment described herein.

FIG. 10 illustrates the XPS raw counts corrected by Schofield photoionization cross sectional relative sensitivity factors for the Si 2p, Ge 3d, $SiO_x$, $GeO_x$, C1s, and O1s peaks normalized to the sum of the Si 2p and Ge 3d substrate peaks for the sputter cleaned $Si_{0.5}Ge_{0.5}(110)$ surface following the total 1.5 MegaLangmuir anhydrous HOOH(g) dose at room temperature, the surface following an additional 1.5 MegaLangmuir anhydrous HOOH(g) at room temperature (3 MegaLangmuir total anhydrous HOOH(g)), and the surface following a final additional 1.5 MegaLangmuir exposure of anhydrous HOOH(g) at room temperature (4.5 MegaLanmguir total anhydrous HOOH(g)). As depicted in FIG. 10, the initial 1.5 MegaLangmuir anhydrous HOOH(g) dose at room temperature shows near saturation, as the additional 1.5 and 3 MegaLangmuir doses increased the surface oxidation by between about 5% and about 7%.

Figure 11:
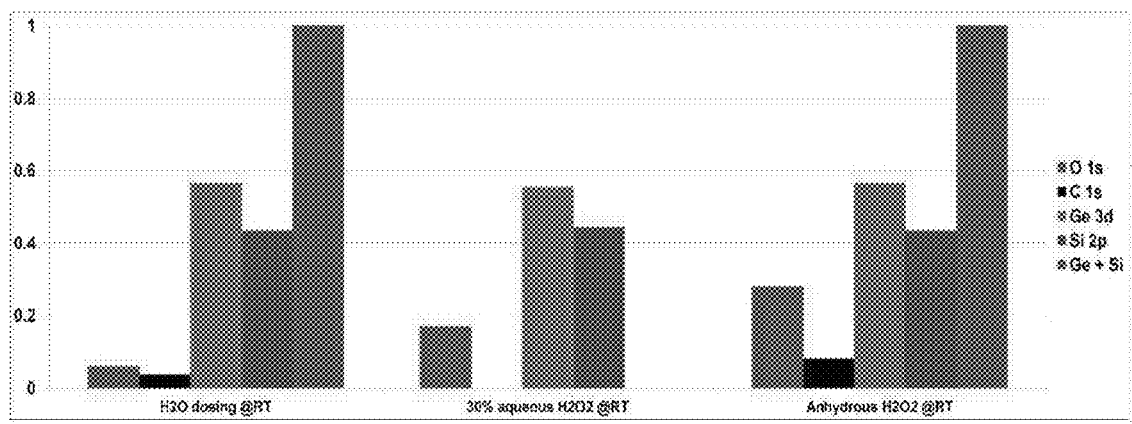
FIG. 11 illustrate XPS data of a substrate exposed to water, aqueous $H_2O_2$, and anhydrous $H_2O_2$ according to one embodiment described herein.

FIG. 11 illustrates the XPS raw counts corrected by Schofield photoionization cross sectional relative sensitivity factors for the Si 2p, Ge 3d, $SiO_x$, $GeO_x$, C1s, and O1s peaks normalized to the sum of the Si 2p and Ge 3d substrate peak for comparison of other oxidation methods at room temperature with the anhydrous HOOH(g) method. FIG. 11 shows the sputter cleaned p-type $Si_{0.5}Ge_{0.5}(110)$ surface dosed with total 15 MegaLanmgmuir water, the sputter cleaned p-type $Si_{0.5}Ge_{0.5}(110)$ surface dosed with 1.5 MegaLangmuir 30% HOOH (70% water), and the sputter cleaned $Si_{0.5}Ge_{0.5}(110)$ surface dosed with a total of 1.5 Mega Langmuir of anhydrous HOOH(g).

As depicted in FIG. 11 oxidation of the sputter cleaned $Si_{0.5}Ge_{0.5}(110)$ surface with anhydrous peroxide leaves the SiGe surface with approximately 1.6 times higher nucleation of GeO$_x$ and SiO$_x$ on the surface as compared with oxidation by 30% HOOH (70% water) and approximately 4.6 times higher nucleation of GeO$_x$ and SiO$_x$ on the surface as compared with oxidation by water. Water dissociates on SiGe leaving —H and —OH bonded to the surface, as hydrogen desorption on silicon and germanium does not occur until temperatures exceeding approximately 220° C. HOOH(g) dissociates on SiGe leaving two —OH groups bonded to surface dangling bonds. As a result, the surface exhibits a higher nucleation of hydroxyl terminated surface sites and the surface is characterized by uniform or substantially coverage of —OH groups ready for further nucleation of ALD with virtually any metal precursor.

SiO$_x$ ALD may be performed on the SiGe(110) surface through cyclically dosing Si$_2$Cl$_6$ and anhydrous HOOH(g) on the —OH terminated SiGe surface. It is noted that both water and anhydrous HOOH processes leave between about 2% and about 7% carbon on the surface due to the utilization of a Teflon pulsed-valve system. However, it is contemplated that the presence of carbon can be substantially or completely eliminated by continuous flow of ultra-high purity nitrogen or argon across the sample surface before and during water or anhydrous HOOH pulses to protect the surface from carbon contamination coming from chamber walls.

The SiO$_x$ seed layer serves several purposes. (1) The dangling bonds of the III-V substrate will be transferred to silicon which are passivated by chlorine. (2) The saturated CVD bilayer of silicon with Cl termination may then react with anhydrous HOOH(g) in order to remove chlorine from the surface and create a HOCl(g) reaction byproduct and terminate silicon with —OH. The —OH terminated surface serves to provide a reactive template for subsequent multilayer SiO$_x$ or subsequent ALD gate oxide nucleation on the III-V semiconductor. ALD of an SiO$_x$ layer also serves to protect metallic substrates from unwanted oxidation and maintain an electrically passive interface. (3) The silicon and SiGe functionalization by an oxidant, such as HOOH(g), creates a saturated Si(Ge)—OH layer which reacts with nearly any metal ALD precursor thereby eliminating the additional processing for metal precursor nucleation (for example with trimethyl aluminum predosing). Functionalization also decreases EOT, lowers border trap density and fixed charged associated with interfacial layers, and even direct bonding of oxide to non-silicon semiconductors. The surface functionalization and ALD procedures can be used for other crystallographic faces, such as In$_x$Ga$_{1-x}$As(110), In$_x$Ga$_{1-x}$Sb(110), In$_x$Ga$_{1-x}$N(110), and SiGe(001)/(110), Some ALD precursors, such as those containing O or OH groups, may directly react with the Si—Cl termination. (4) The Si—O$_x$ seed layer with additional oxide ALD can be employed for metal contact formation.

The ALD deposited Si—O$_x$ seed layer on III-V and silicon-germanium alloyed substrates are applicable for use as a semiconductor functionalization protection layer while providing protection in vacuum from oxidation and carburization. It is contemplated that the embodiment described herein are useful during deposition and processing of gate stacks on FinFETs for MOSFETs. Embodiments of the disclosure also provide for surface termination by Si—Cl groups followed by functionalization with HOOH(g) which result in Si—OH termination. By keeping the semiconductor substrate chemically protected at all times, the layer can be transferred within a typical semiconductor processing tool.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
    heating a substrate in a reaction chamber to a temperature of between 300° C. and 500° C.;
    exposing the substrate to a chlorosilane precursor utilizing a chemical vapor deposition process; and
    exposing the substrate to an anhydrous HOOH precursor utilizing the chemical vapor deposition process, wherein a chlorine terminated saturated silicon bilayer is deposited on the substrate.

2. The method of claim 1, wherein the substrate comprises one or more of indium gallium arsenide, indium gallium antimonide, indium gallium nitride, silicon germanium, and metallic materials.

3. The method of claim 2, wherein the reaction chamber is heated to a temperature of 350° C.

4. The method of claim 1, wherein the chlorosilane precursor is selected from the group consisting of SiCl$_4$, Si$_2$Cl$_6$, and Si$_3$Cl$_8$.

5. The method of claim 1, further comprising:
    exposing the substrate to an Si$_2$Cl$_6$ precursor utilizing an atomic layer deposition process; and
    exposing the substrate to an anhydrous HOOH precursor utilizing the atomic layer deposition process, where in the atomic layer deposition process cyclically exposes the substrate to the Si$_2$Cl$_6$ precursor and the anhydrous HOOH precursor in an alternating manner.

6. The method of claim 1, further comprising:
    cleaning the substrate by a de-capping process or atomic H exposure prior to exposing the substrate to either of the chlorosilane precursor or the anhydrous HOOH precursor.

7. The method of claim 1, wherein the exposing the substrate to a chlorosilane precursor comprises dosing of at least 3 MegaLangmuir of Si$_2$Cl$_6$.

8. The method of claim 7, wherein the dosing is performed between 1 and 7 times.

9. The method of claim 7, further comprising:
    exposing the substrate to a 500 Langmuir atomic hydrogen dose.

10. The method of claim 1, wherein the exposing the substrate to an anhydrous HOOH precursor comprises dosing of at least 550,000 Langmuir of HOOH.

11. The method of claim 10, wherein the dosing is performed between 1 and 6 times to achieve a total anhydrous HOOH dosage of 210.55 MegaLangmuir.

12. The method of claim 11, further comprising:
    cyclically dosing Si$_2$Cl$_6$ and anhydrous HOOH at 350° C. to form an atomic layer deposition silicon oxide multilayer on the substrate.

13. The method of claim 1, further comprising:
    exposing the substrate to a trimethyl aluminum precursor at 250° C.

14. The method of claim 13, wherein the trimethyl aluminum precursor total dosage is 300,000 Langmuir performed in two dosages.

15. A substrate processing method, comprising:
    heating a III-V material substrate in a reaction chamber to a temperature of between 300° C. and 500° C.;
    exposing the substrate to an Si$_2$Cl$_6$ precursor utilizing a chemical vapor deposition process;
    exposing the substrate to an anhydrous HOOH precursor utilizing the chemical vapor deposition process; and exposing the substrate to an $Si_2Cl_6$ precursor utilizing an atomic layer deposition process; and exposing the substrate to an anhydrous HOOH precursor utilizing the atomic layer deposition process, where in the atomic layer deposition process cyclically exposes the substrate to the $Si_2Cl_6$ precursor and the anhydrous HOOH precursor in an alternating manner.

16. The method of claim 15, wherein the chemical vapor deposition process and the atomic layer deposition process are performed at 350° C.

17. The method of claim 15, wherein the exposing the substrate to an $Si_2Cl_6$ precursor is performed utilizing the chemical vapor deposition process with a total dosage of 87.6 MegaLangmuir.

18. The method of claim 17, wherein the exposing the substrate to an anhydrous HOOH precursor is performed utilizing the chemical vapor deposition process with a total dosage of 210.55 MegaLangmuir.

19. A substrate processing method, comprising:
heating a III-V material substrate in a reaction chamber to a temperature of 350° C.;
dosing the substrate with 87.6 MegaLangmuir $Si_2Cl_6$;
dosing the substrate with 210.55 MegaLangmuir anhydrous HOOH after the dosing the substrate with $Si_2Cl_6$;
dosing the substrate with 300,000 Langmuir trimethyl aluminum at 250° C.; and
dosing the substrate with 500 Langmuir atomic hydrogen at 250° C.

20. The method of claim 19, further comprising:
exposing the substrate to an $Si_2Cl_6$ precursor utilizing an atomic layer deposition process; and
exposing the substrate to an anhydrous HOOH precursor utilizing the atomic layer deposition process, where in the atomic layer deposition process cyclically exposes the substrate to the $Si_2Cl_6$ precursor and the anhydrous HOOH precursor in an alternating manner.

* * * * *